United States Patent
Cho et al.

(10) Patent No.: US 9,502,603 B2
(45) Date of Patent: Nov. 22, 2016

(54) VERTICALLY STRUCTURED GROUP III NITRIDE SEMICONDUCTOR LED CHIP AND METHOD FOR MANUFACTURING THE SAME

(75) Inventors: Meoung Whan Cho, Yongin (KR); Seog Woo Lee, Suwon (KR);
(Continued)

(73) Assignees: WAVESQUARE INC., Yongin (KR); DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/117,281

(22) PCT Filed: May 12, 2011

(86) PCT No.: PCT/JP2011/002657
§ 371 (c)(1),
(2), (4) Date: May 19, 2014

(87) PCT Pub. No.: WO2012/153370
PCT Pub. Date: Nov. 15, 2012

(65) Prior Publication Data
US 2014/0319557 A1 Oct. 30, 2014

(51) Int. Cl.
*H01L 33/00* (2010.01)
*H01L 33/32* (2010.01)
*H01L 33/38* (2010.01)

(52) U.S. Cl.
CPC ......... *H01L 33/0025* (2013.01); *H01L 33/007* (2013.01); *H01L 33/0075* (2013.01);
(Continued)

(58) Field of Classification Search
CPC ............. H01L 33/0007; H01L 33/0079; H01L 33/38; H01L 33/0075; H01L 33/0025; H01L 33/32
See application file for complete search history.

(56) References Cited

U.S. PATENT DOCUMENTS 6,924,210 B1    8/2005   Daubenspeck et al.
2003/0189215 A1*   10/2003   Lee et al. ................. 257/94
(Continued)

FOREIGN PATENT DOCUMENTS

CN    101120452 A    2/2008
EP    1 798 781 A2    6/2007
(Continued)

OTHER PUBLICATIONS

Nov. 24, 2014 Office Action issued in Korean Application No. 1020147028765.
(Continued)

*Primary Examiner* — Su C Kim
(74) *Attorney, Agent, or Firm* — Oliff PLC

(57) ABSTRACT

A method for manufacturing a vertically structured Group III nitride semiconductor LED chip includes a first step of forming a light emitting structure laminate; a second step of forming a plurality of separate light emitting structures by partially removing the light emitting structure laminate to partially expose the growth substrate; a third step of forming a conductive support, which conductive support integrally supporting the light emitting structures; a fourth step of separating the growth substrate by removing the lift-off layer; and a fifth step of dividing the conductive support between the light emitting structures thereby singulating a plurality of LED chips each having the light emitting structure. A first through-hole is formed to open in a central region of each of the light emitting structures such that at least the lift-off layer is exposed, and an etchant is supplied from the first through-hole in the fourth step.

7 Claims, 12 Drawing Sheets

(75) Inventors: Pil Guk Jang, Suwon (KR); Ryuichi Toba, Akita (JP); Yoshitaka Kadowaki, Akita (JP)

(52) U.S. Cl.
CPC ........... *H01L 33/0079* (2013.01); *H01L 33/32* (2013.01); *H01L 33/38* (2013.01)

(56) References Cited

U.S. PATENT DOCUMENTS

| | | | |
|---|---|---|---|
| 2006/0056123 A1* | 3/2006 | Aoyagi | H01L 25/167 361/56 |
| 2006/0073676 A1 | 4/2006 | Chen et al. | |
| 2006/0234407 A1 | 10/2006 | Kim et al. | |
| 2008/0035935 A1* | 2/2008 | Shum | 257/79 |
| 2008/0128716 A1* | 6/2008 | Tazima | H01L 33/20 257/88 |
| 2008/0150087 A1 | 6/2008 | Farooq et al. | |
| 2009/0098712 A1 | 4/2009 | Taguchi et al. | |
| 2010/0148309 A1 | 6/2010 | Liang et al. | |
| 2011/0303938 A1 | 12/2011 | Uemura et al. | |

FOREIGN PATENT DOCUMENTS

| | | |
|---|---|---|
| JP | S5116869 A | 2/1976 |
| JP | H02240975 A | 9/1990 |
| JP | H08293476 A | 11/1996 |
| JP | 2000346648 A | 12/2000 |
| JP | 2001-244503 A | 9/2001 |
| JP | 2002076435 A | 3/2002 |
| JP | 2005252222 A | 9/2005 |
| JP | 2006030329 A | 2/2006 |
| JP | 2006086469 A | 3/2006 |
| JP | 2006228855 A | 8/2006 |
| JP | 2006237339 A | 9/2006 |
| JP | 2006303429 A | 11/2006 |
| JP | A-2008-78275 | 4/2008 |
| JP | B2-4172657 | 10/2008 |
| JP | 2009-099681 A | 5/2009 |
| JP | A-2010-93186 | 4/2010 |
| JP | A-2010-147164 | 7/2010 |
| JP | A-2010-147166 | 7/2010 |
| JP | A-2010-287681 | 12/2010 |
| JP | A-2011-96707 | 5/2011 |
| JP | A-2011-96881 | 5/2011 |
| KR | 2006-0109378 A | 10/2006 |
| KR | 20090028931 A | 3/2009 |
| TW | 200620708 A | 6/2006 |
| TW | 200917354 A | 4/2009 |
| WO | WO 2011/055462 A1 | 5/2011 |

OTHER PUBLICATIONS

Jan. 19, 2015 Office Action issued in Chinese Application No. 200980163264.6.
Feb. 5, 2013 Office Action issued in Japanese Application No. 2011-539246.
Jun. 25, 2013 Office Action issued in Japanese Application No. 2011-539246.
Dec. 27, 2013 Office Action issued in Korean Application No. 10-2012-7012716.
Dec. 8, 2009 Search Report issued in International Application No. PCT/JP2009/069230.
Apr. 4, 2014 Office Action issued in U.S. Appl. No. 14/017,889.
Jun. 13, 2013 Office Action issued in Korean Application No. 10-2012-7012716.
Sep. 4, 2014 extended European Search Report issued in European Application No. 09851114.0-1551.
Sep. 9, 2014 Office Action issued in U.S. Appl. No. 14/017,889.
Sep. 2, 2014 Office Action issued in Japanese Application No. 2011-539246.
Mar. 20, 2014 Office Action issued in U.S. Appl. No. 13/503,582.
Jul. 11, 2014 Office Action issued in U.S. Appl. No. 13/503,582.
Oct. 18, 2013 Office Action issued in U.S. Appl. No. 13/503,582.
Jul. 23, 2014 Office Action issued in Korean Patent Application No. 10-2012-7012716.
International Search Report issued in International Patent Application No. PCT/JP2011/002657 dated Jun. 21, 2011.
May 6, 2014 Office Action issued in Chinese Application No. 200980163264.6.
May 27, 2015 Official Decision of Refusal issued in Korean Patent Application No. 10-2014-7028765.
Apr. 15, 2016 Office Action issued in European Patent Application No. 09851114.0.
Jun. 29, 2016 Office Action issued in Korean Patent Application No. 10-2013-7032452.

* cited by examiner (A)

(B)

(C)

(D)

(E)

(A)

(B)

(A)

(B)

VERTICALLY STRUCTURED GROUP III NITRIDE SEMICONDUCTOR LED CHIP AND METHOD FOR MANUFACTURING THE SAME

TECHNICAL FIELD

The present invention relates to a vertically structured LED chip in which Group III nitride semiconductor layers are stacked, and a method for manufacturing the same.

BACKGROUND ART

In general, Group III-V semiconductors made of compounds of Group III elements and Group V elements are widely used for devices such as light emitting diodes (LEDs).

A Group III nitride semiconductor using Al, Ga, In, or the like as a Group III element and using N as a Group V element has a high melting point and a high dissociation pressure of nitrogen, which makes it difficult to perform bulk single crystal growth. Further, conductive single crystal substrates having large diameter are not available at low cost. Accordingly, such a semiconductor is typically formed on a sapphire substrate.

However, since the sapphire substrate has an insulating property, electric current does not flow in the substrate. Accordingly, a lateral structure in which electric current flows in a lateral direction has been conventionally used. This structure is obtained by partially removing a light emitting structure laminate formed by sequentially growing an n-type Group III nitride semiconductor layer, an active layer (light emitting layer), and a p-type Group III nitride semiconductor layer on a sapphire substrate, to expose the n-type Group III nitride semiconductor layer, and providing an n-type electrode and a p-type electrode on the exposed n-type Group III nitride semiconductor layer and the p-type Group III nitride semiconductor layer, respectively.

In response to this, in recent years, the following technique for obtaining vertical structure LED chips has been studied. After forming a buffer layer made of a certain element other than a Group III element (for example, Al, Ga, or the like) on a sapphire substrate, a light emitting structure laminate is formed. The light emitting structure laminate is supported by a conductive support, and then a sapphire substrate is separated (lifted off) by selectively dissolving the buffer layer by chemical etching. The conductive support and the light emitting structure laminate are sandwiched between a pair of electrodes (see JP 4172657 B (PTL 1)). Note that a "buffer layer" herein is a buffer layer for epitaxial growth of a light emitting structure laminate, which also serves as a lift-off layer for separating the light emitting structure laminate from a sapphire substrate.

CITATION LIST

Patent Literature

PTL 1: JP 4172657 B

SUMMARY OF INVENTION

Technical Problem

In order to manufacture a nitride semiconductor chip having a vertical structure such as an LED, a typical chemical lift-off process in which a lift-off layer made of a metal other than Group III elements or a metal nitride is etched to separate an epitaxial layer from a sapphire substrate, or a photochemical lift-off process in which etching is performed while activating a lift-off layer by irradiation with light such as ultraviolet light, is used. They are processes in which a lift-off layer is immersed in a certain solution thereby lifting off an epitaxial layer from a growth substrate, and are collectively referred to as "chemical lift-off processes" in this specification. An alternative expression may be "a growth substrate is lifted-off from an epitaxial layer".

Here, the lift-off layer to be etched has a small thickness of about several nanometers to several tens of nanometers, so that the etching solution cannot be easily supplied to the gap between a substrate having an area of several inches and an epitaxial layer. Thus, several days have been required to complete all etching steps in some cases.

Further, the present inventors performed a primary division by grooving a light emitting structure laminate made of a Group III nitride semiconductor on a sapphire substrate with a grid pattern by dry etching up to the sapphire substrate, thereby turning the light emitting structure laminate into a plurality of separate light emitting structures. Next, a conductive support having the shape of a substrate integrally supporting the light emitting structures was formed, and then the sapphire substrate was separated by the chemical lift-off process. Each of the light emitting structures after the lift-off is still integrally supported by the conductive support. This was found to result in the formation of cracks in the separate light emitting structures which had been lifted off, at a considerable rate. The cracks seem to form when the light emitting structures supported by the conductive support are detached from the sapphire substrate in the lift-off.

The formation of such cracks has not been disclosed in publicly available patent documents, professional literature, or the like partly because this technique is in the course of study and development. However, this is a critical problem to be solved for achieving mass production of vertically structured Group III nitride semiconductor LED chips.

In view of the above problem, an object of the present invention is to provide a high quality vertically structured Group III nitride semiconductor LED chip with reduced cracks formed in the light emitting structures, and a method for more effectively manufacturing the LED chip.

Solution to Problem

In order to achieve the above object, the present invention primarily includes the following components.

(1) A method for manufacturing a vertically structured Group III nitride semiconductor LED chip, comprising: a first step of forming a light emitting structure laminate by sequentially stacking a first conductivity type Group III nitride semiconductor layer, a light emitting layer, and a second conductivity type Group III nitride semiconductor layer on a growth substrate with a lift-off layer provided therebetween, the second conductivity type being different from the first conductivity;

a second step of forming a plurality of separate light emitting structures by partially removing the light emitting structure laminate to partially expose the growth substrate;

a third step of forming a conductive support having a lower electrode, which conductive support integrally supporting the plurality of the light emitting structures;

a fourth step of separating the growth substrate from the plurality of the light emitting structures by removing the lift-off layer using a chemical lift-off process; and a fifth step of dividing the conductive support between the light emitting structures thereby singulating a plurality of LED chips each having the light emitting structure supported by the conductive support, wherein a first through-hole is formed to open in a central region of each of the light emitting structures such that at least the lift-off layer is exposed, before the fourth step, and an etchant is supplied from the first through-hole in the fourth step.

(2) The method for manufacturing a vertically structured Group III nitride semiconductor LED chip, according to (1) above, wherein in the third step, a second through-hole is provided in a portion penetrating through the conductive support, corresponding to the central region of each of the light emitting structures, in communication with the through-hole in the light emitting structure.

(3) The method for manufacturing a vertically structured Group III nitride semiconductor LED chip, according to (1) or (2) above, wherein the light emitting structures are made to have a cross-sectional shape with rounded corners in the second step.

(4) The method for manufacturing a vertically structured Group III nitride semiconductor LED chip, according to (3) above, wherein the light emitting structures are made to have a cross-sectional shape of a quadrangle with rounded corners in the second step.

(5) The method for manufacturing a vertically structured Group III nitride semiconductor LED chip, according to (4) above, wherein $R/L_0$ is in the range of 0.1 to 0.5, where R is a curvature radius of the corners of the light emitting structures, and $L_0$ is a length of a side of the quadrangle of the light emitting structures, provided that the corners of the quadrangle are not rounded.

(6) The method for manufacturing a vertically structured Group III nitride semiconductor LED chip, according to any one of (1) to (5) above, wherein the first through-hole and/or the second through-hole have/has a diameter of 20 μm or more.

(7) The method for manufacturing a vertically structured Group III nitride semiconductor LED chip according to any one of (1) to (6) above, wherein the third step is performed by any one of a bonding method, a wet deposition process, and a dry deposition process.

(8) A vertically structured Group III nitride semiconductor LED chip manufactured by the method for manufacturing a vertically structured Group III nitride semiconductor LED chip according to any one of (1) to (7) above, comprising a first through-hole in a central region of each of the light emitting structures.

(9) A vertically structured Group III nitride semiconductor LED chip comprising: a conductive support having a lower electrode; a light emitting structure having a second conductivity type III nitride semiconductor layer provided on the conductive support, a light emitting layer provided on the second conductivity type III nitride semiconductor layer, and a first conductivity type III nitride semiconductor layer provided on the light emitting layer, the first conductivity type being different from the second conductivity type; and an upper electrode provided on the light emitting structure, wherein through-holes are provided in a central region of the light emitting structure to penetrate the light emitting structure and the support.

Advantageous Effect of Invention

According to the present invention, a first through-hole is formed to open in a central region of each of light emitting structures such that at least a lift-off layer is exposed, and an etchant is supplied from the first through-hole. Thus, high quality vertically structured Group III nitride semiconductor LED chips with reduced cracks formed in the light emitting structures can be manufactured more efficiently.

DESCRIPTION OF EMBODIMENTS

Figure 1:
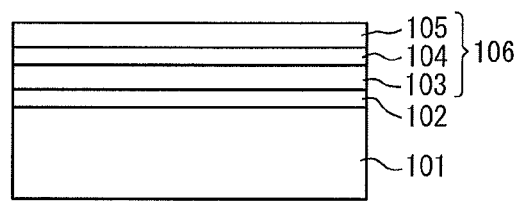
FIGS. 1(A) to 1(E) schematically show a flow of a method for manufacturing vertically structured Group III nitride semiconductor LED chips 100 according to an embodiment of the present invention.
Figure 1:
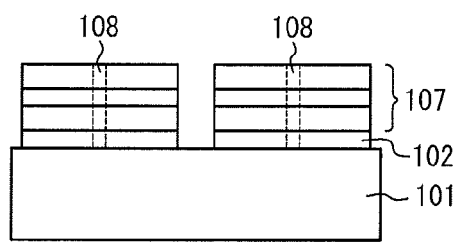
Figure 1:
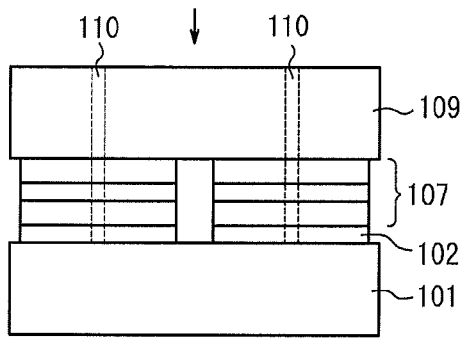
Figure 1:
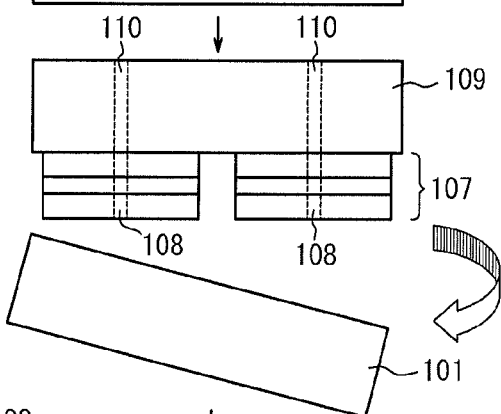
Figure 1:
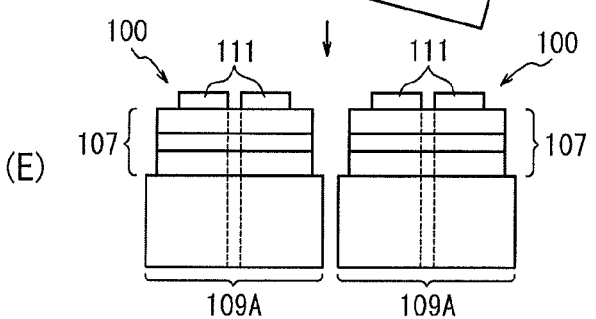

The present invention will be described in more detail, with reference to the accompanying drawings. In principle, components that are common to vertical type LED chips according to the present invention and vertical type LED chips of Comparative Examples are herein denoted by reference numerals having the same two last digits, and thus their descriptions will not be repeated. Further, in the schematic cross-sectional views of LED chips, the lift-off layer and light emitting structure laminate are enlarged for the sake of explanation; accordingly, the ratio between the illustrated components does not conform to the actual ratio.

The method for manufacturing a vertically structured Group III nitride semiconductor LED chip (hereinafter, simply referred to as "vertical type LED chip") 100 according to an embodiment of the present invention includes as shown in FIGS. 1(A) to 1(E): a first step of forming a light emitting structure laminate 106 by sequentially stacking a first conductivity type Group III nitride semiconductor layer 103, a light emitting layer 104, and a second conductivity type Group III nitride semiconductor layer 105 on a growth substrate 101 with a lift-off layer 102 provided therebetween, the second conductivity type being different from the first conductivity (FIG. 1(A)); a second step of forming a plurality of separate light emitting structures 107 of an island shape for example, by partially removing the light emitting structure laminate 106 to partially expose the growth substrate 101 (FIG. 1(B)); a third step of forming a conductive support 109 having a lower electrode, which conductive support 109 integrally supporting the plurality of the light emitting structures 107 (FIG. 1(C)); a fourth step of separating the growth substrate 101 from the plurality of the light emitting structures 107 by removing the lift-off layer 102 using a chemical lift-off process (FIG. 1(D)); and a fifth step of dividing the conductive support 109 between the light emitting structures 107 by cutting or the like thereby singulating a plurality of LED chips 100 each having the light emitting structure 107 supported by the cut conductive support 109A (FIG. 1(E)), wherein a first through-hole 108 is formed to open in a central region of each of the light emitting structures 107 such that at least the lift-off layer 102 is exposed (to the growth substrate 101 in FIG. 1) in the second step shown in FIG. 1(B) before the fourth step, and an etchant is supplied from the first through-hole 108 in the fourth step shown in FIG. 1(D) thereby selectively etching the lift-off layer 102 from the center to the edge. Further, in the third step shown in FIG. 1(C), a second through-hole 110 is provided in a portion penetrating through the conductive support 109, corresponding to the central region of each light emitting structure 107, in communication with the through-hole 108 in the light emitting structure 107. Note that as shown in FIG. 1(E), another step of forming an upper electrode 111 on the side of separation of the light emitting structure 107 may be added after the fourth step (separation step).

The inventors of the present invention found that the formation of cracks in the light emitting structures 107 can be sufficiently suppressed by supplying an etchant from the first through-hole 108 to selectively etch the lift-off layer 102 from the center to the edge. Further, the foregoing separation can reduce time required for etching, which made it possible to more efficiently manufacture vertical type LED chips.

The technical meaning of the present invention will be described as compared with the techniques of Comparative Examples.

Comparative Example 1

Figure 9:
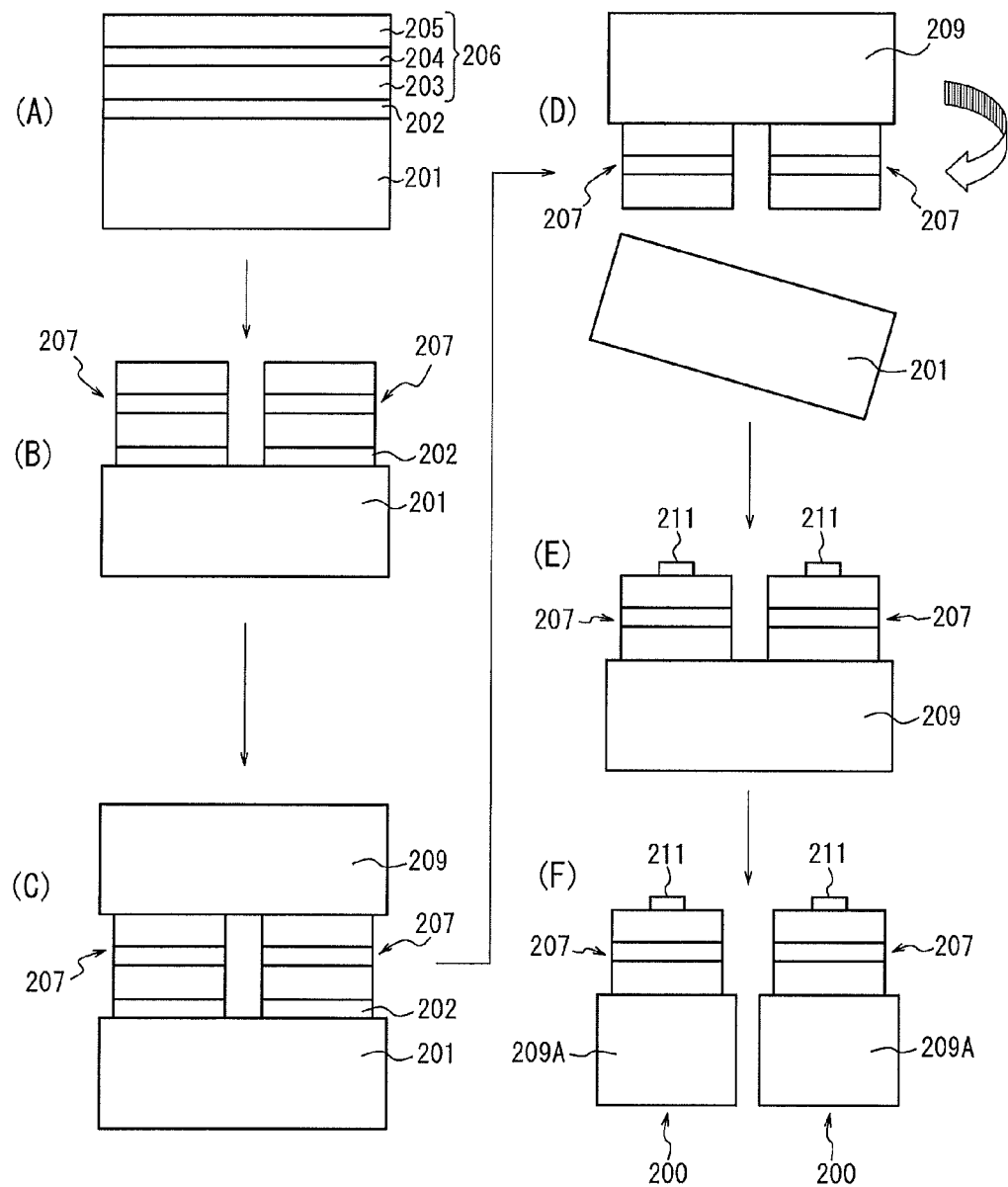
FIGS. 9(A) to 9(F) schematically show a flow of a method for manufacturing vertical type LED chips 200 according to Comparative Example 1.
Figure 10:
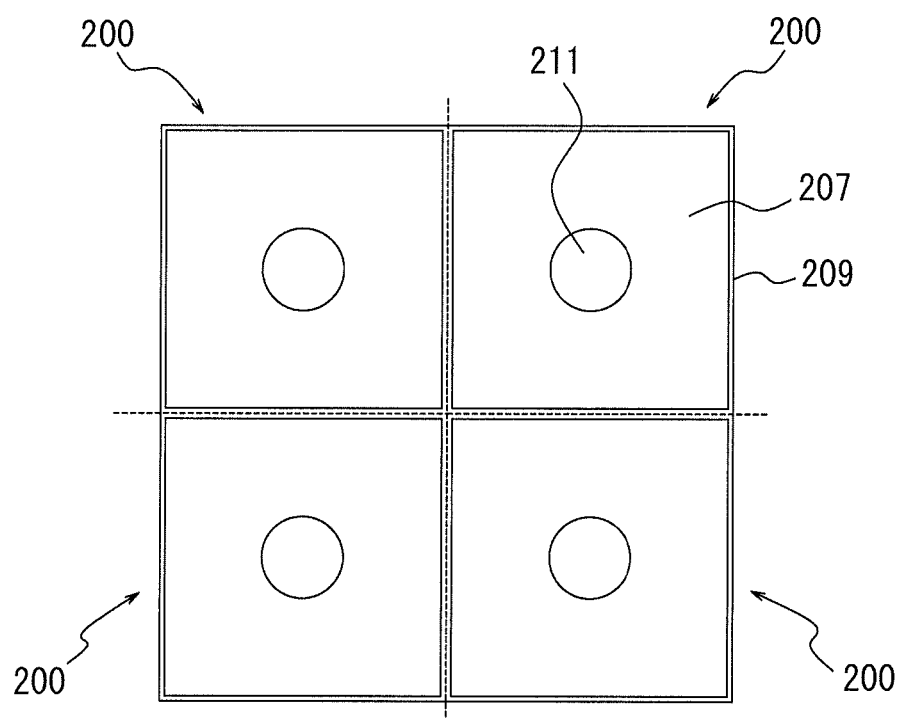
FIG. 10 is a top view schematically showing a wafer on which a plurality of light emitting structures before being singulated are formed (state shown in FIG. 9(E)).

FIGS. 9(A) to 9(F) schematically show a flow of a method for manufacturing vertical type LED chips 200 according to Comparative Example 1. This manufacturing method includes a first step of forming a light emitting structure laminate 206 by sequentially stacking a first conductivity type Group III nitride semiconductor layer 203, a light emitting layer 204, and a second conductivity type Group III nitride semiconductor layer 205 on a growth substrate 201 with a lift-off layer 202 provided therebetween, the second conductivity type being different from the first conductivity (FIG. 9(A)); a second step of forming a plurality of separate light emitting structures 207, by partially removing the light emitting structure laminate 206 to partially expose the growth substrate 201 (FIG. 9(B)); a third step of forming a conductive support 209 also serving as a lower electrode, which conductive support 209 integrally supporting the plurality of the light emitting structures 207 (FIG. 9(C)); a fourth step of separating the growth substrate 201 from the plurality of the light emitting structures 207 by removing the lift-off layer 202 using a chemical lift-off process (FIG. 9(D)); a step of forming an upper electrode 211 on the side of separation of the light emitting structure 207 (FIG. 9(E)); and a fifth step of dividing the conductive support 209 between the light emitting structures 207 by cutting or the like thereby singulating a plurality of LED chips 200 each having the light emitting structure 207 supported by the cut conductive support 209A (FIG. 9(F)). As shown in FIG. 10, the light emitting structures 207 have a square cross-sectional shape. Further, there is no through-hole in the central region of each of the light emitting structures 207, and a through-hole serving as an etchant inlet is also not provided, in particular, in a portion of the support 209 between the light emitting structures 207. Accordingly, etching proceeds from the edge of the lift-off layer 202 in the fourth step. FIG. 10 is a top view schematically showing a wafer on which a plurality of light emitting structures before being singulated are formed (state shown in FIG. 9(E)) and the singulation is to be performed along the broken lines.

Figure 11:
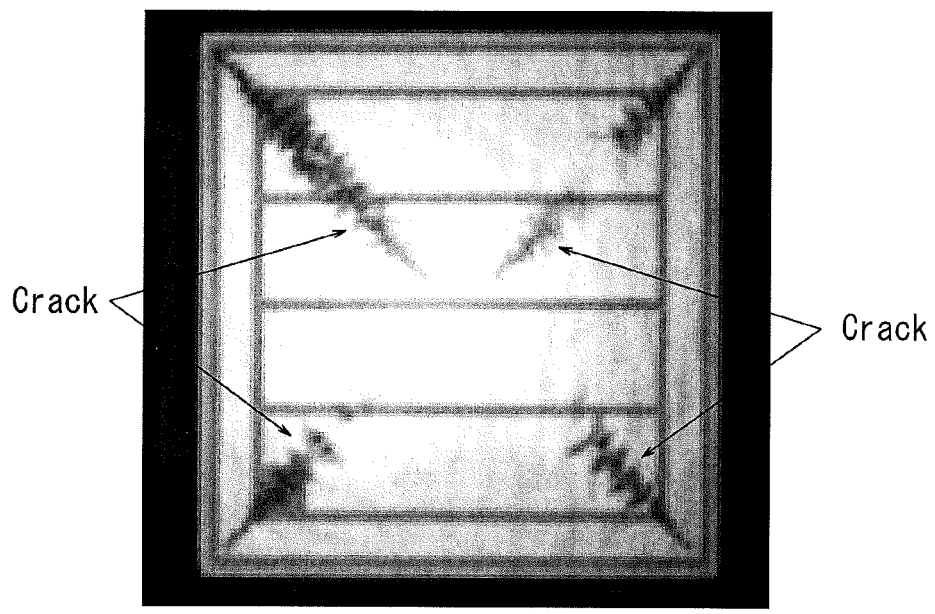
FIG. 11(A) is a photograph showing cracks formed in a light emitting structure of an LED chip manufactured by the method shown in FIG. 9.
FIG. 11(B) is a photograph showing cracks formed in a light emitting structure of an LED chip manufactured by the method according to Comparative Example 3.
Figure 11:
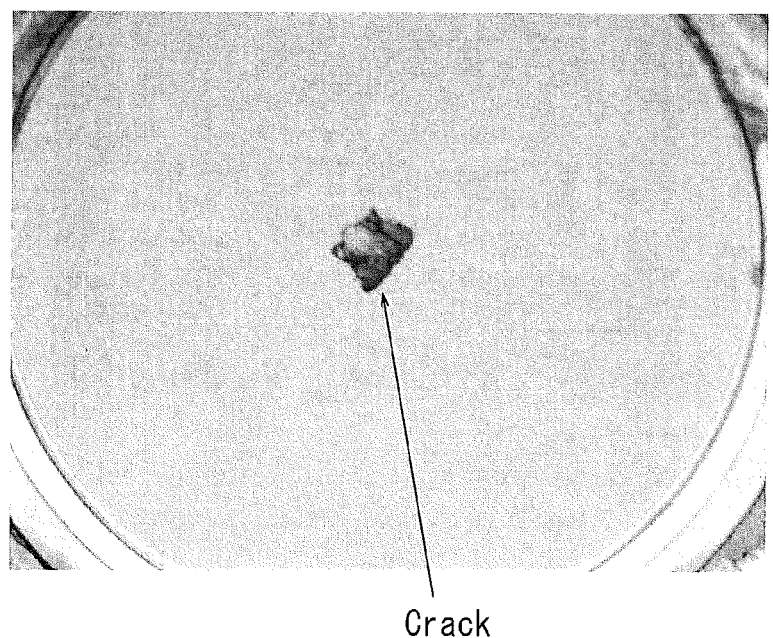

According to the studies of the inventors, it was found that cracks were formed in the light emitting structures at a high rate after the lift-off of the above method. FIG. 11(A) shows the state where cracks were formed when lift-off was actually performed according to the comparative example, observed from above with an optical microscope. One side of the light emitting structures 207 is 1000 μm in length. X-shaped crack bands are shown to extend from the vicinity of the corners to the center portion. (This is Comparative Example 1 to be described below, and the incidence of the cracks was 95.5%.) The product with cracks is regarded as a defective product, which involves serious problems in terms of yield, cost, and productivity. Such cracks extending to the center are formed significantly in light emitting structures of large size chips having a side of 500 μm or more in length.

Such cracks are formed to extend from corners, and this is considered to be associated with distribution of stresses, such as the stresses between the growth substrate 201 and the light emitting structures 207 and connected supports 209 at a dissolution front portion of the lift-off layer, that concentrate at the vicinity of the corners of the dissolution front of the light emitting structures when the growth substrate 201 is separated from the light emitting structures 207. The cracks seem to form when the light emitting structures 207 are detached from the growth substrate 201 in the lift-off. Further, this method has another problem in that the separation takes a significantly long time to be completed, since etching proceeds from the edge of the lift-off layer 202.

In order to reduce such cracks formed in Comparative Example 1, the inventors considered Comparative Examples 2 to 4 described below.

Comparative Example 2

Figure 12:
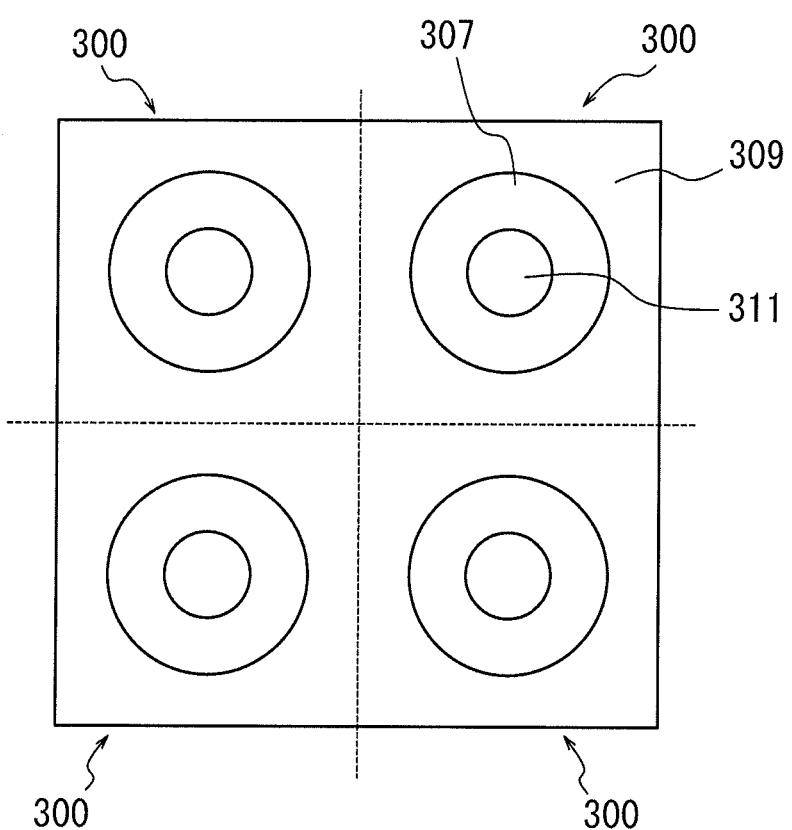
FIG. 12 is a top view schematically showing a wafer on which a plurality of light emitting structures before being singulated in a method for manufacturing a vertical type LED chip 300 according to Comparative Example 2.

FIG. 12 is a top view schematically showing a wafer on which a plurality of light emitting structures before being singulated in a method for manufacturing a vertical type LED chip 300 according to Comparative Example 2. This method is the same as in Comparative Example 1 except that in the step of forming the plurality of separate light emitting structures 307, the light emitting structures 307 had a circular cross-sectional shape. Specifically, there is no through-hole in the central region of each of the light emitting structures 307, and no through-hole serving as an etchant inlet is provided, in particular, in a portion of the support 309 between the light emitting structures 307. Consequently, etching proceeds from the edge of the lift-off layer (not shown) in the fourth step. In FIG. 12, reference numeral 311 denotes an upper electrode. Further, singulation is performed along the broken lines.

According to the studies of the inventors, it was found that cracks extending from the corners to the center were effectively reduced in the light emitting structures after the lift-off performed by the method. This is considered because the light emitting structures have a circular shape, which prevented stresses from being concentrated at the corners during etching (conflict between the vectors of etching proceeding from the edges). The above is described by the inventors in PCT/JP2009/069230. However, after that, it was found that crack spots were newly formed inside the light emitting structures at a considerable incidence. Further, this method also has a problem to be solved in that the separation takes a significantly long time to be completed.

Comparative Example 3

Figure 13:
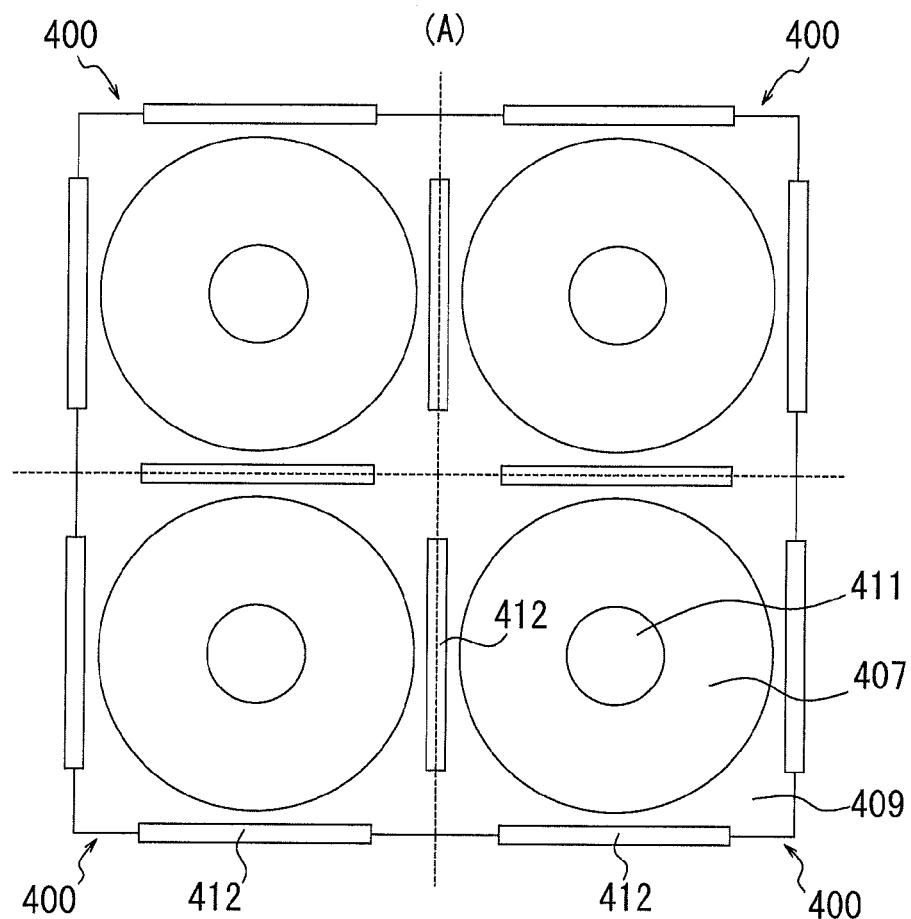
FIG. 13(A) is a top view schematically showing a wafer on which a plurality of light emitting structures before being singulated in a method for manufacturing a vertical type LED chip 400 according to Comparative Example 3.
FIG. 13(B) is a side view schematically showing one of LED chips 400 singulated along the broken lines in FIG. 13(A).
Figure 13:
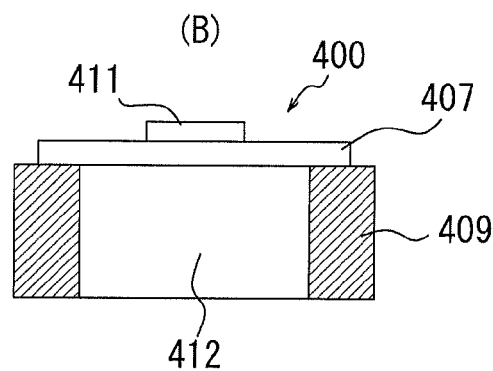

FIG. 13(A) is a top view schematically showing a wafer on which a plurality of light emitting structures 407 before being singulated in a method for manufacturing a vertical type LED chip 400 according to Comparative Example 3, and FIG. 13(B) is a side view schematically showing one of LED chips 400 singulated along the broken lines in FIG. 13(A). This method is the same as in Comparative Example 2 except that through-grooves 412 were provided along the cut lines in portions of a support 409 between light emitting structures 407. Specifically, the light emitting structures 407 have a circular cross-sectional shape and no through-holes are provided in the central regions therein. Further, since an etchant can be supplied from the through-grooves 412, etching proceeds from the edge of each LED chip before being singulated, in the fourth step. In FIG. 13, reference numeral 411 denotes an upper electrode.

According to the studies of the inventors, the form of cracks formed in the individual light emitting structures 407 after the lift-off was the same as in Comparative Example 2. FIG. 11(B) shows the state where cracks were formed when lift-off was actually performed according to the comparative example, observed from above with an optical microscope. Crack spots are formed in the central portion of the light emitting structures. Further, in the case of this method, etching proceeds from the edge of each device, so that the time required for separation is shorter than in Comparative Examples 1 and 2. However, the time required for the separation is desirably reduced further.

Comparative Example 4

Figure 14:
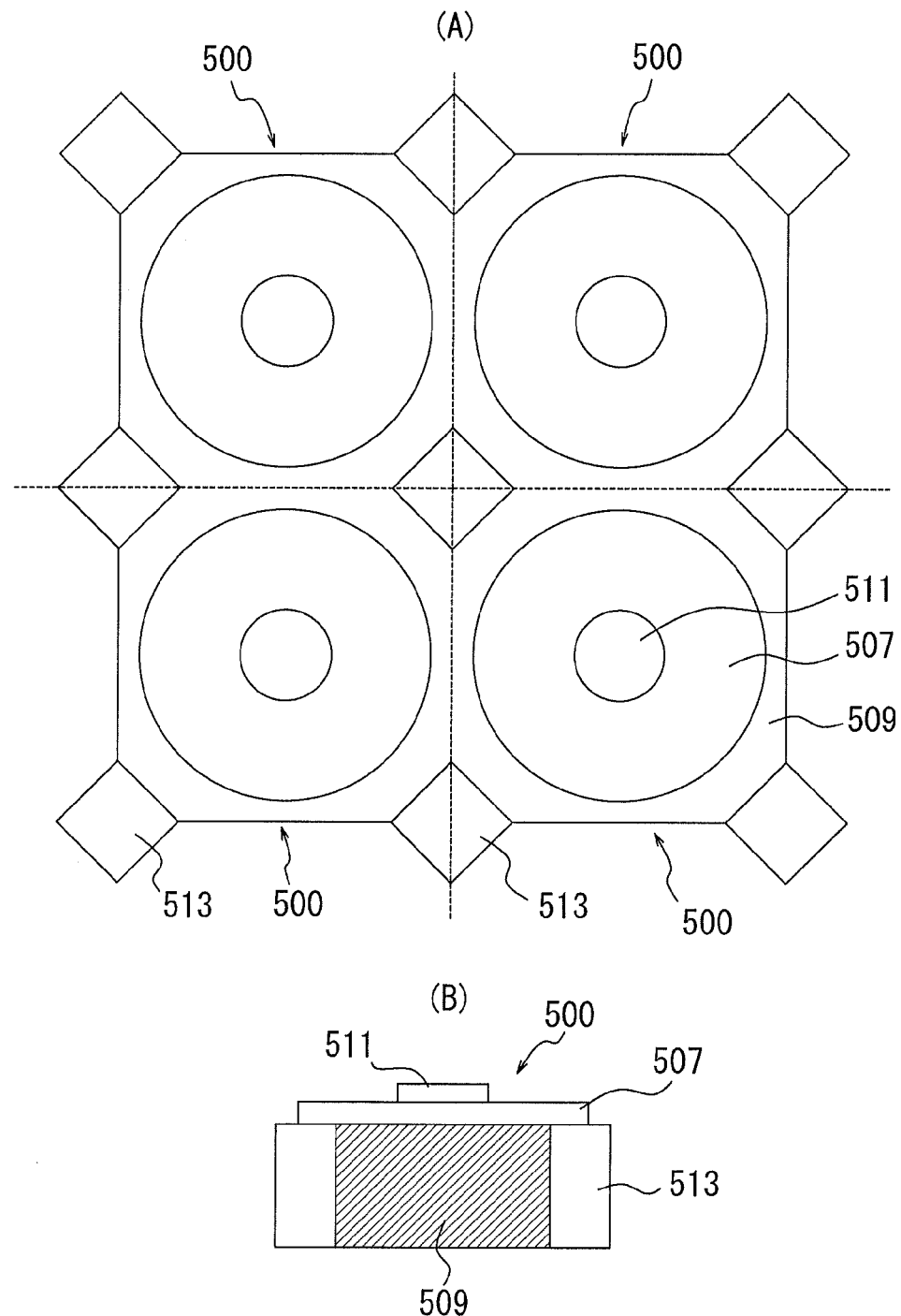
FIG. 14(A) is a top view schematically showing a wafer on which a plurality of light emitting structures before being singulated in a method for manufacturing a vertical type LED chip 500 according to Comparative Example 4.
FIG. 14(B) is a side view schematically showing one of LED chips 500 singulated along the broken lines in FIG. 14(A).

FIG. 14(A) is a top view schematically showing a wafer on which a plurality of light emitting structures 507 before being singulated in a method for manufacturing a vertical type LED chip 500 according to Comparative Example 4, and FIG. 14(B) is a side view schematically showing one of LED chips 500 singulated along the broken lines in FIG. 14(A). This method is the same as in Comparative Example 2 except that through-holes 513 were provided in a portion of a support 509 between light emitting structures (at the intersections of the cut lines). Specifically, the light emitting structures 507 have a circular cross-sectional shape and no through-holes are provided in the central region therein. Further, since an etchant can be supplied from the through-holes 513, etching proceeds from the edge of each LED chip before being singulated, in the fourth step. In FIG. 14, reference numeral 511 denotes an upper electrode.

According to the studies of the inventors, the form of cracks formed in the individual light emitting structures 507 after the lift-off was the same as in Comparative Example 2. Further, also in this method, etching proceeds from the edge of each device, so that the time required for separation is shorter than in Comparative Examples 1 and 2. However, the time required for the separation is desirably reduced further.
(Embodiment of the Present Invention)

The inventors made various studies on the form of crack spots formed in Comparative Examples 2 to 4. When an etchant is supplied from the edge side of light emitting structures as in Comparative Examples 3 and 4, etching proceeds from the edge to the center in the lift-off layer. It was found that local stresses are applied to the dissolution front portion where the light emitting structures are detached from the growth substrate, that is, the boundary region between a portion where the light emitting structures are attached to the growth substrate with the lift-off layer provided therebetween and a portion where they are detached from each other, thereby forming cracks. When the etching on the lift-off layer is about to be completed, the lift-off layer still remain at the central portion, which leads to the formation of cracks due to stresses concentrated at the central portion. Although in the case of Comparative Example 2, the final stage of the etching occurs at the central portion of the light emitting structures.

Figure 2:
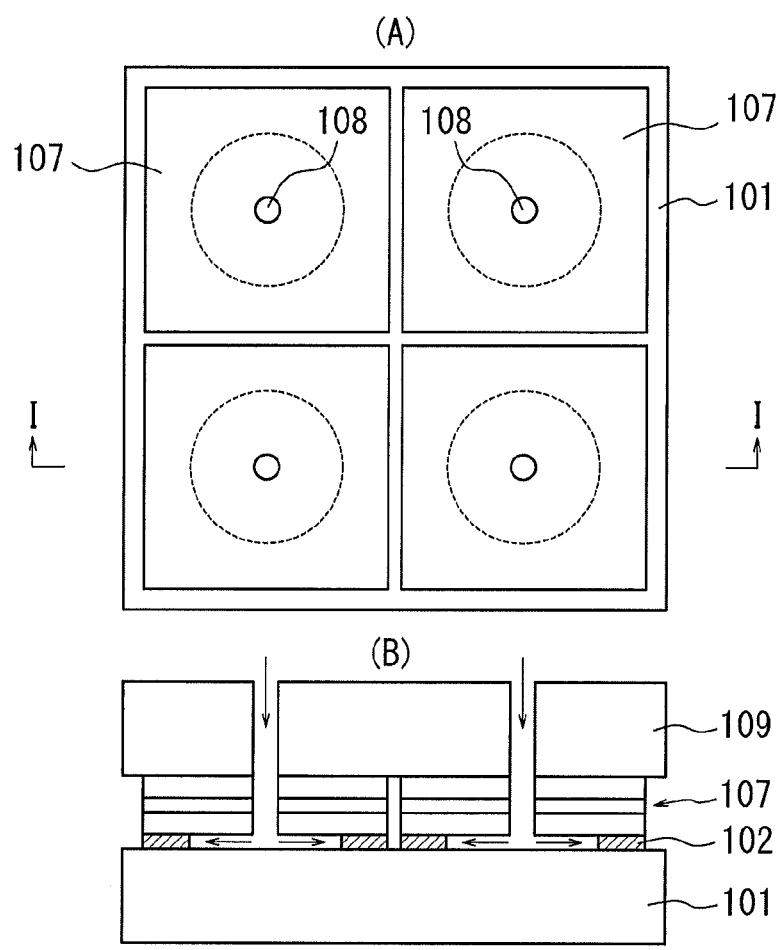
FIG. 2(A) is a top view schematically showing a wafer being lifted off in the process of a manufacturing method according to an embodiment of the present invention (top view with a conductive support 109 being omitted)
FIG. 2(B) is a cross-sectional view taken along line I-I in the state of FIG. 2(A).

On the other hand, in this embodiment, the progress of etching and operation and effects of the etching are as follows. FIG. 2(A) is a top view schematically showing a wafer being lifted off in the process of a manufacturing method according to an embodiment of the present invention (top view with a conductive support 109 being omitted), and FIG. 2(B) is a cross-sectional view taken along line I-I in the state of FIG. 2(A). FIGS. 4(A) to 4(D) are photomicrographs showing the progress of actual etching in Example 1 described below. An etchant is supplied from the first through-holes 108, and the lift-off layer 102 is selectively etched from the central portion to the edge. On this occasion, the dissolution front portion concentrically expands to the edge, which can prevent stresses from being concentrated at the central region of the light emitting structures 107. As a result, the formation of crack spots at the central region of the light emitting structures 107 can be suppressed. Further, since the etching is not performed from the side surface of the lift-off layer, the formation of X-shaped cracks widely extending from the corners to the central portion can also be suppressed. Further, etching on the individual light emitting structures on the wafer can be performed almost simultaneously in the same manner. Moreover, the time required for etching was successfully reduced. Thus, vertical type LED chips can be manufactured more efficiently.

Further, in this embodiment, etching propagates from the central portion of the lift-off layer 102, the distance between adjacent light emitting structures (pitch between the devices) can be smaller than in Comparative Examples as long as the light emitting structures can be isolated from each other. Thus, the light emitting area can be increased, and crack formation can be suppressed with reduced loss of the effective area per wafer. Although the effect varies depending on the chip size, when the size of the light emitting structures is 1000 µm square, by way of example, the width of the division grooves in Comparative Examples was 200 µm to 250 µm for ensuring the path of the etchant. However, the width of the division grooves may be 80 µm in this method. The area required per chip was 1.44 mm$^2$ to 1.56 mm$^2$ in the former examples. On the other hand, only 1.17 mm$^2$ is required in this embodiment, so that the number of the devices to be obtained is increased by 23% to 33%. In other words, both effects of the suppression of crack formation and increase in the effective area can increase the yield per wafer.

Figure 3:
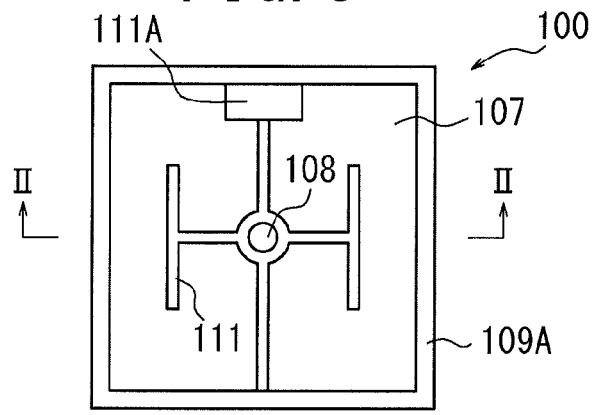
FIG. 3 is a top view schematically showing a vertically structured Group III nitride semiconductor LED chip 100 according to an embodiment of the present invention.

FIG. 3 is a top view schematically showing a vertically structured Group III nitride semiconductor LED chip 100. The vertically structured Group III nitride semiconductor LED chip 100 includes a conductive support 109A having a lower electrode; a light emitting structure 107 having a second conductivity type III nitride semiconductor layer 105 provided on the conductive support 109A, a light emitting layer 104 provided on the second conductivity type III nitride semiconductor layer 105, and a first conductivity type III nitride semiconductor layer 103 provided on the light emitting layer 104, the first conductivity type being different from the second conductivity type; and an upper electrode provided on the light emitting structure 107, wherein through-holes 108 and 110 are provided in a central region of the light emitting structure 107 to penetrate the light emitting structure 107 and the support 109A. Note that reference numeral 111A denotes a pad electrode.

(First Step)

A sapphire substrate or an AlN template substrate in which an AlN film is formed on a sapphire substrate is preferably used as the growth substrate 101. The growth substrate may be selected depending on the kind of a lift-off layer to be formed, the composition of Al, Ga, and In of the light emitting structure laminate made of a Group III nitride semiconductor, the quality of LED chips, cost, and the like.

The lift-off layer 102 is preferably a buffer layer made of a metal other than Group III elements such as CrN or a metal nitride in a chemical lift-off process, since such a buffer layer can be dissolved by chemical selective etching. The lift-off layer 102 is preferably deposited by sputtering, vacuum deposition, ion plating, or MOCVD.

The first conductivity type and the second conductivity type of the light emitting structure laminate 106 may be n-type and p-type, respectively or opposite thereto. The first conductivity type Group III nitride semiconductor layer 103, the light emitting layer 104, and the second conductivity type Group III nitride semiconductor layer 105 can be epitaxially grown on the lift-off layer 102 by MOCVD.

(Second Step)

It is preferable to employ dry etching for partially removing the light emitting structures 106. This is because end points of etching of the light emitting structure laminate 106 made of a Group III nitride semiconductor layer can be reproducibly controlled. Further, when adjacent light emitting structures 107 are joined, division grooves are required to be formed again in a later step. Therefore, the removal of part of the light emitting structures 106 is performed such that part of the growth substrate 101 is exposed. The first through-holes 108 can be formed at any time before the fourth step, but preferably added to this second step. A step of forming a through-hole may be added before or after the second step. Alternative methods may be considered, in which a portion which is not grown in the first step may be used as the through-hole, or the first through-hole is formed by forming a second through-hole in the third step. However, these alternative methods would result in deteriorated productivity due to increased number of steps.

In the present invention, it is preferable to provide a first through-hole 108 at the center of a circle circumscribing a light emitting structure in terms of promoting highly uniform etching; however, the present invention is not limited thereto. "Central region" is herein referred to as a region covering a range of 0.4 L from the center of the circumscribed circle, where length L refers to the radius of the circle circumscribing the light emitting structure; the region more preferably covers a region covering a range of 0.2 L from the center. The first through-hole 108 can be provided in the central region. Alternatively, if the aspect ratio of the light emitting structures is high (for example, twice or more), a plurality of inscribed circles may be defined and a group of the centers of the inscribed circles may be regarded as a "central region". In this case, one or a plurality of through-holes may be provided in the central region.

The cross-sectional shape of the through-holes is not limited in particular, and for example, may be a circular shape or a similar shape to the light emitting structures.

When the first through-holes 108 and/or the second through-holes 110 have a circular shape, the diameter of them is preferably 20 µm or more. When the diameter is less than 20 µm, the through-hole 108 would not reach the lift-off layer in the wafer plane when formed by dry etching, which would hinder the progress of etching on the lift-off layer. Further, in terms of achieving sufficient effect of reducing the time required for etching, the diameter is preferably 50 µm or more. Note that excessively large through-holes are not preferable either, since this wastes a large area of the light emitting structures. In terms of ensuring sufficient area of the light emitting structures, the diameter is preferably 50% or less, more preferably 30% or less, with respect to the length L2 of the light emitting structures.

In the present invention, the cross-sectional shape of the light emitting structures 107 is not limited in particular. For example, the light emitting structures may have a square shape in the second step as described above. However, in the second step, the light emitting structures have a cross-sectional shape with rounded corners. The cross-sectional shape is preferably a quadrangle with rounded corners in terms of facilitating the cutting.

Figure 4:
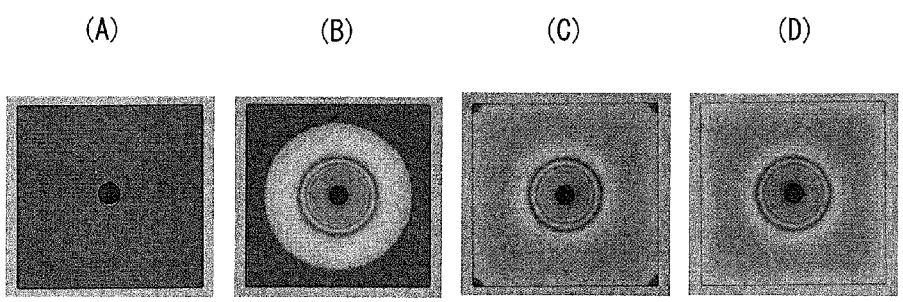
FIGS. 4(A) to 4(D) are photographs of LED chips before being singulated, showing the progress of etching in a process of a manufacturing method according to an embodiment of the present invention.
Figure 5:
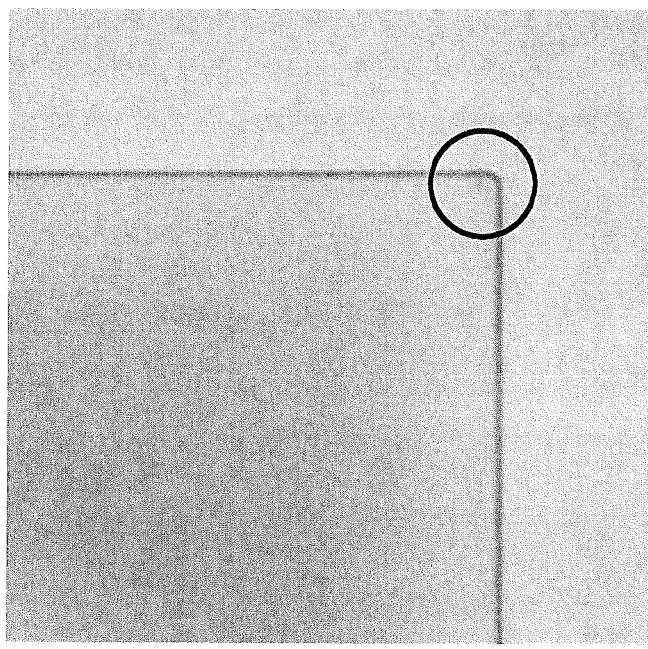
FIG. 5 is a photograph showing cracks formed at a corner of a light emitting structure of an LED chip after the etching in FIGS. 4(A) to 4(D).

According to the studies of the inventors, when the light emitting structures have a square shape as in examples shown in FIGS. 4(A) to 4(D), although X-shaped cracks widely extending from the corners to the center were prevented from forming, whereas very small cracks were found to form at the corners as shown in FIG. 5. It was also found that a shape having rounded corners distributed the stress applied to the light emitting structures 107 being transferred to the support 109 after being detached from the growth substrate 101 upon etching, which can sufficiently suppress the formation of the small cracks, and higher quality LED chips can be obtained.

The expression "rounded" may be restated as "curved to having a radius of curvature" or "beveled", and the shape is preferably but not limited to smooth and arcuate. Alternatively, the corners may have a plurality of some type of cut surfaces with curved surfaces.

Here, in the present invention, slight roundness is sufficient to preclude the small cracks at the corners from forming, as described above. Thus, cracks can be precluded from forming while ensuring large light emitting area and without wasting large effective area per wafer. Specifically, the area reduced by rounding corners of the light emitting structures is preferably 10% or less, more preferably 5% or less with respect to the area in cases where the corners are not rounded.

Figure 6:
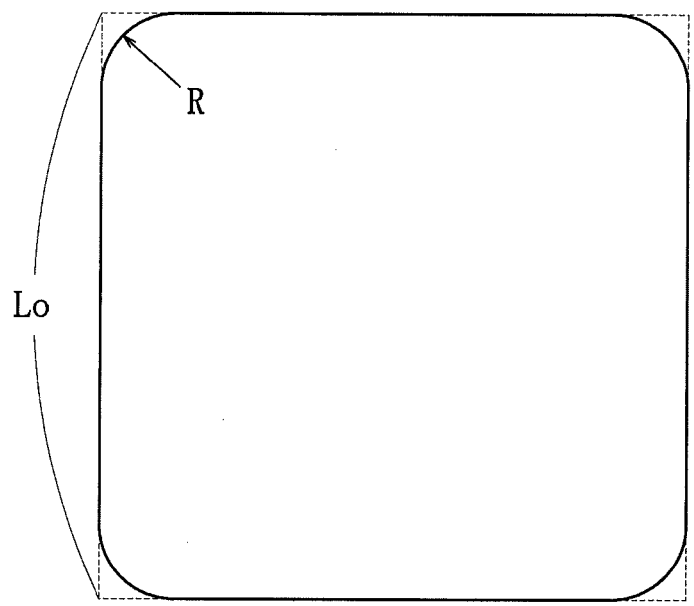
FIG. 6 is a diagram schematically showing a light emitting structure, illustrating a case where the light emitting structure has a cross-sectional shape having rounded corners in a manufacturing method according to another embodiment of the present invention.

Further, as shown in FIG. 6, $R/L_0$ is preferably in the range of 0.1 to 0.5, where R is a curvature radius of the corners of the light emitting structures, and $L_0$ is a length of a side of the quadrangle of the light emitting structures, provided that the corners of the quadrangle are not rounded. If $R/L_0$ is less than 0.1, formation of small cracks at the corners would not be sufficiently suppressed, whereas if $R/L_0$ exceeds 0.5, the area of the light emitting structures would not be sufficiently ensured. Note that, here, the radius of the arc inscribed between two lines of a light emitting structure, that intersect at a corner thereof before being rounded is referred to as radius of curvature R.

(Third Step)

Although not shown in the drawings, in the third step, an ohmic electrode layer and a connection layer are preferably formed between the plurality of light emitting structures 107 and the conductive support 109 such that the ohmic electrode layer is in contact with each of the plurality of light emitting structures 107 and the connection layer is in contact with the conductive support 109. More preferably, an additional reflection layer is formed between the ohmic electrode layer and the connection layer; or, the ohmic electrode layer also serves as a reflection layer. These layers can be formed by a dry deposition process such as vacuum vapor deposition, ion plating, or sputtering.

The foregoing ohmic electrode layer can be formed of a high work function metal, for example, a noble metal such as Pd, Pt, Rh, Au, or Ag; or Co or Ni. The above ohmic electrode layer can be used also as a reflection layer since Rh and the like have high reflectivity. However, when the emission wavelengths are in the range of green to blue, a layer of Ag, Al, or the like is preferably used. Whereas, when the emission wavelengths are in an ultraviolet range, a layer of Rh, Ru, or the like is preferably used. Further, the kind of the connection layer depends on the method of forming the conductive support 109. When the conductive support 109 is bonded to the connection layer by a bonding method, for example, thermocompression bonding, the connection layer can be made of Au, Au—Sn, solder, or the like.

When a bonding method is employed, a conductive silicon substrate, a CuW alloy substrate, a Mo substrate, or the like in which second through-holes 110 are previously formed are suitable for the support 109 in terms of thermal expansion coefficient and thermal conductivity. The bonding is performed such that the through-holes in the light-emitting structures and the support are aligned. Further, the conductive support 109 may be formed by wet or dry plating. For example, Cu or Au electroplating is employed; Cu, Ni, Au, or the like can be used as the connection layer. On this occasion, the first through-holes 108 and the second through-holes 110 are protected with resist or the like so that they are not filled by the connection layer or the plating layer.

(Fourth Step)

The fourth step is preferably performed by the above described typical chemical lift-off process or photochemical lift-off process. Examples of etchants that can be used include a diammonium cerium nitrate solution or a potassium ferricyanide-based solution when the lift-off layer is made of CrN. Whereas when the lift-off layer is made of ScN, examples of the etchants include hydrochloric acid, nitric acid, or organic acid.

Further, surfaces of the light emitting structures 107 that have been exposed by the fourth step are preferably cleaned by wet washing. Then, a given thickness of the surfaces is trimmed by dry etching and/or wet etching, and an n-type ohmic electrode and a bonding pad electrode are formed by lift-off using a resist as a mask. Al, Cr, Ti, Ni, Pt, Au, or the like is used as an electrode material. Pt, Au, or the like is deposited as a cover layer on the ohmic electrode and the bonding pad to reduce wiring resistance and improve adhesion of the wire bonding. Note that the side surfaces and surfaces of the light emitting structures 107 may be provided with a protective film made of $SiO_2$, SiN, or the like. After the lift-off, a protective film may be provided on the through-holes as well.

(Fifth Step)

In the fifth step, cutting between the light emitting structures 107 is performed using for example a blade dicer or a laser dicer. In order to prevent heat or crushing damage on the light emitting structures 107, the light emitting structures 107 are generally put inside the periphery of each conductive support portion 109A, with a typical margin of about 10 μm to 30 μm.

The above shows examples of typical embodiments, and the present invention is not limited to those embodiments.

EXAMPLES

Experimental Example 1

First, circumstances of etching on a lift-off layer via through-holes at the center of each light emitting structure will be described. On a (0001) sapphire substrate, a metal Cr was deposited to 18 nm sputtering, a nitriding process was then performed in an ammonia gas atmosphere in an MOCVD apparatus. After that, on the CrN buffer layer (also serving as a lift-off layer) formed, a blue LED structure layer having an InGaN-based light emitting layer was grown to 10 μm. Next, division grooves reaching a growth substrate were made by dry etching thereby forming 1200 μm square square light emitting structures. The device pitch was 1280 μm. In this case, the corners of the light emitting structures are not intentionally beveled. At the same time, through-openings having a diameter of 100 μm were made in the light emitting structures. Next, a Cu layer was deposited to 1 μm by sputtering thereby forming a connection layer for plating. Further, a 100 μm thick support was formed by electroplating. Note that pillars made of thick film resists were formed in the through-openings, thereby preventing the through-openings from being filled during plating. At this point of time, the thick film resists in through-openings were not plated with Cu, and the resists were removed thereby forming through-holes penetrating from light emitting structures to the support.

Subsequently, the lift-off layer was etched with an etchant supplied from the through-holes. FIGS. 4(A) to 4(D) show the progress of etching, observed from the transparent sapphire substrate side with an optical microscope. The lift-off layer has a metallic gray color, so that it looks black in the photograph. FIG. 4(A) shows a state before etching, and etching proceeds while uniformly propagating toward the outside from the concentric center as shown in FIG. 4(B) (the lift-off layer becomes transparent by being dissolved). In FIG. 4(D) the lift-off layer slightly remains at the four corners; however, the separation is completed finally as in FIG. 4(D).

FIGS. 4(A) to 4(D) show that in this experimental example, macroscopic X-shaped cracks as shown in FIG. 11(A) are not formed. Further, macro crack spots were not also observed in the entire area from the center. However, close observation showed that microcracks having a length of 10 μm or less might be formed in the vicinity of the corners as shown in FIG. 5. This was considered because the stresses should be locally concentrated at the portions at the corners where the lift-off layer slightly remains as shown in FIG. 4(C).

Experimental Example 2

In response, in order to preclude the stresses from being concentrated at the portions when the etching of the lift-off layer is about to be completed, distributing the stresses to the dissolved portions was considered. In cases of etching the lift-off layer by supplying an etchant from the center of the light emitting structures, etching proceeds like a circle expands isotropically as shown in FIGS. 4(A) to 4(D). The length of the arcs at the four corners of a plane of the light emitting structures is associated with the level of distribution of the stresses (see FIG. 6); accordingly, the shape of the beveled portions at the corners and the incidence of microcracks were examined. Note that microcracks formed even at one of the four corners result in a defective chip. Accordingly, the crack formation was determined per chip.

Here, this experiment was performed using a radius R of a circle inscribed between the intersecting lines as a parameter, provided that the length of the square before being beveled was $L_0$. The method of preparing samples was the same as the process described in Experimental Example 1. The diameter of through-holes provided at the center of light emitting structures was 50 μm. The samples were prepared to have an R of 156 μm, 240 μm, 330 μm, 417 μm, 505 μm, and 600 μm with the $L_0$ being 1200 μm. The ratios of the areas of beveled squares to the areas of the respective squares before being beveled were 98.5%, 96.6%, 93.5%, 89.6%, 84.8%, and 78.5%.

Figure 7:
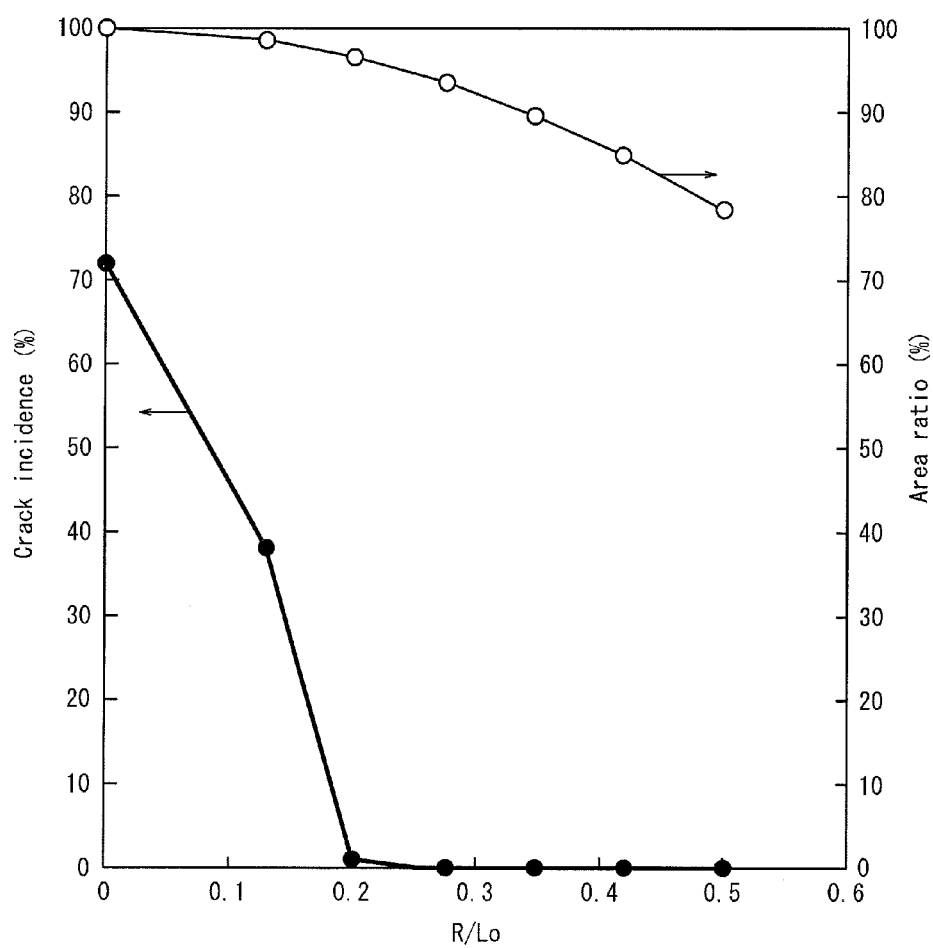
FIG. 7 is a graph showing the relationship between $R/L_0$ and crack incidence in Example.

For each sample having the $R/L_o$ shown above, the formation of microcracks in 2200 to 2600 light emitting structures, the relationship shown in FIG. 7 was found. Here, the horizontal axis represents the ratio of R to $L_0$, whereas the vertical axis on the left represents the incidence of microcracks. Note that the vertical axis on the right represents the ratio of the area of a light emitting structure to the area of a light emitting structure assumed to be a square not rounded at the corners. Consequently, when the value of $R/L_0$ was 0.1 or more, the effect of suppressing the formation of microcracks became evident, whereas the formation of microcracks was sufficiently suppressed when the value was 0.2 or more. Note that when the value of $R/L_0$ is 0.5, the light emitting structure is circular in shape. There is a concern that reduction in the area of a plane of a light emitting structure leads to reduced light output power; however, such reduction can be deemed to be recovered by improving the epitaxial growth conditions and other device structures. Accordingly, in order to suppress the formation of microcracks, the $R/L_0$ is in the range of 0.1 or more, and more preferably 0.2 or more up to 0.5. For example, when the R is 240 μm ($R/L_0$=0.2), the formation of cracks can be significantly suppressed even if the loss of light emitting area due to the roundness is 3.4%.

Experimental Example 3

Figure 8:
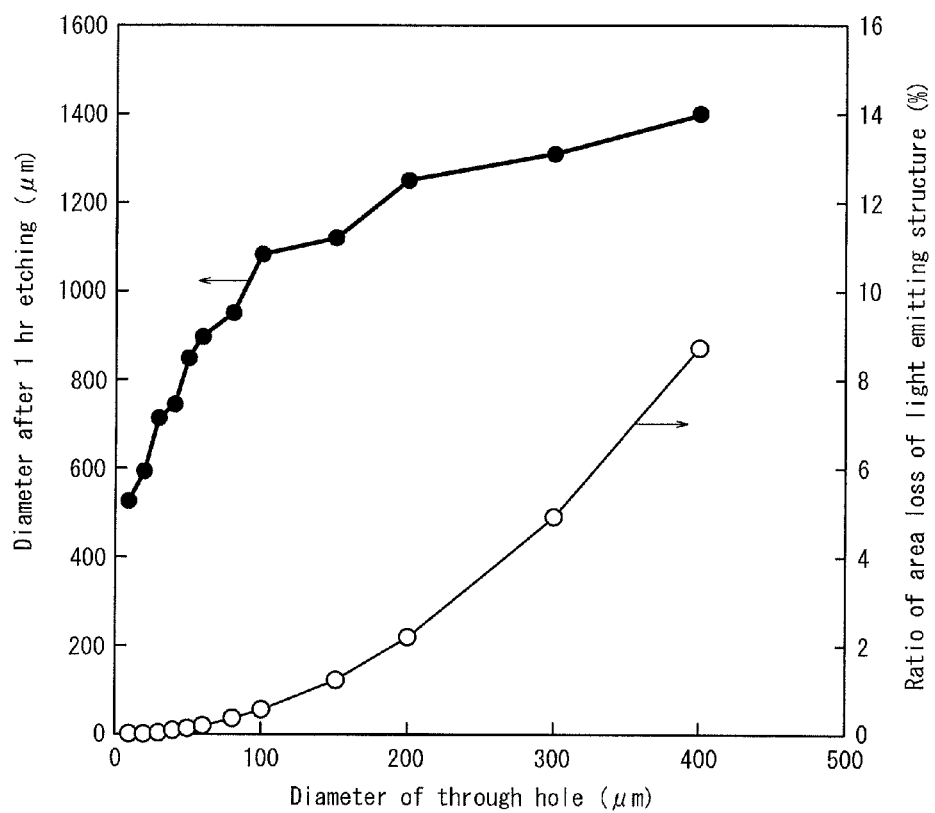
FIG. 8 is a graph showing the relationship between the diameter of a through-hole and the etch diameter in one hour in Example.

Next, the relationship between the diameter of through-holes for supplying an etchant and the etch rate of a lift-off layer was examined. Samples were prepared in the same method as in Experimental Example 1. However, the diameter of the through-holes at the center of light emitting structures and the ones in the support was in the range of 10 μm to 400 μm. The lift-off layer was immersed in the etchant for 1 hour, the relationship was evaluated by etching amount corresponding to the diameter of the circle of a dissolution front portion formed by the etching. FIG. 8 shows the evaluation result, which shows that the larger the diameter of the through-holes is, the larger the etch diameter is. However, when the diameter of the through-holes is 200 μm or more, increase in the etching amount became moderate. Note that since the etchant is supplied only from the center, the above trend is constant without depending on the area of portions corresponding to the light emitting structures. Moreover, when the diameter of the through-holes was 10 μm, etching was possible; however, when the through-holes were formed in the light emitting structures by dry etching, there were cases where the through-holes did not reach the lift-off layer, so that the lift-off layer was not partially etched. When the diameter was 20 μm or more, such a problem did not occur. Therefore, the size of the through-holes is preferably 20 μm or more. Note that the vertical axis on the right side in FIG. 9 represents the area loss ratio of a light emitting structure with respect to the diameter of the through-hole, where the $L_0$ is 1200 μm. The loss ratio changes as the $L_0$ changes, so that the diameter of the through-holes can be determined as appropriate by adding the etch rate and the like.

Example

A lift-off layer (CrN layer, thickness: 18 nm) was formed on a sapphire substrate, and then an n-type Group III nitride semiconductor layer (GaN layer, thickness: 7 μm), a light emitting layer (InGaN-based MQW layer, thickness: 0.1 μm), and a p-type Group III nitride semiconductor layer (GaN layer, thickness: 0.2 μm) were sequentially stacked to form a light emitting structure laminate. Subsequently, the light emitting structure laminate was partially removed to partially expose the sapphire substrate, thereby obtaining square light emitting structures having rounded corners. Thus, a plurality of light emitting structures isolated like islands were formed. The width W of each of the semiconductor structures was 1200 μm, and the devices were arranged in a matrix. The pitch between the devices is 1280 μm. The length $L_0$ of a side of the square before rounding the corners was 1200 μm, the curvature radius R of the corners was 330 μm, and the $R/L_0$ was 0.275.

When the above light emitting structures were formed, a through-hole having a diameter of 50 μm was formed at a central position in each of the separate light emitting structures.

An ohmic electrode layer (Ag, thickness: 0.1 μm) and a connection layer (Ti/Cu, thickness: 1.5 μm) were formed on the light emitting structures (except for the through-holes), and the through-holes were covered with thick film resists. After that, Cu (thickness: 80 μm) was formed by a first plating, and Cu (thickness: 80 μm) was formed by an additional second plating, thereby obtaining supports. Each of plating was electroplating using a copper sulfate-based electrolyte solution, where the temperature of the solution was in the range of 25° C. to 30° C., and the deposition rate was 35 μm/hr. At this point of time, the thick film resists in through-holes were not plated with Cu, and the resists were removed thereby forming the through-holes penetrating from the light emitting structures to the support.

Subsequently, the sapphire substrate was separated using a chemical lift-off process. The formation of macro/microcracks in the light emitting structures after lift-off was examined with an optical microscope. The number of the examined light emitting structures was 3860, and no macro/microcracks were formed. Further, etching was completed in two hours.

Comparative Example 1

A sample as shown in FIG. 10 was prepared in the same manner as in Example except that the light emitting structures had a shape of a square having an $L_0$ of 1000 μm, through-holes were not formed in the central regions, and the device pitch was 1250 μm. The light emitting structures after lift-off were observed with an optical microscope to find that X-shaped cracks widely extending from the corners to the center were formed in 1824 out of 1910 of the examined structures, and the incidence was 95.5%. Further, etching was completed in 32 hours.

Comparative Example 2

A sample as shown in FIG. 12 was prepared in the same manner as in Example except that the light emitting structures had a shape of a circle having an diameter of 1000 μm, through-holes were not formed in the central regions, and the device pitch was 1250 μm. The light emitting structures after lift-off were observed with an optical microscope to find that X-shaped cracks widely extending from the corners to the center were formed in 437 out of 1890 of the examined structures (incidence was 23.1%). Crack spots were formed in the center of 1607 of the light emitting structures, and the incidence was 85.0%. Further, etching was completed in 28 hours.

Comparative Examples 3 and 4

In the manufacturing process of Comparative Example 2, samples as shown in FIG. 13 (Comparative Example 3) or FIG. 14 (Comparative Example 4) were prepared in the same manner as in Comparative Example 2 except that through-grooves or through-holes were formed in the supports through the following steps.

An ohmic electrode layer (NiO and Ag) was formed on a p-layer of each of the individual light emitting structures, and then a photo resist was embedded in a division groove and an opening was meanwhile formed in the p-ohmic electrode layer portion of each of the light emitting structures, thereby forming a connection layer (Ni/Au/Cu) for connecting the structures to the supports. Next, pillars of thick film resists were formed in order to prevent a Cu film from being formed in plating to be described. The pillars were formed on the grid lines surrounding light emitting structures as shown in FIG. 13(A) or at the points where the lines intersect as shown in FIG. 14(A). Note portions of the connection layer on the pillar formation positions were previously removed by etching.

Next, electroplating with Cu was performed using a copper sulfate-based electrolyte solution to form a 80 μm conductive support. The solution temperature was in the range of 25° C. to 30° C., and the deposition rate was 25 μm/hr. Then, the pillar portions and the resists embedded in the division grooves were removed by chemical cleaning, and grooves or holes penetrating the conductive support were formed. Note that the through-grooves shown in FIG. 13(A) were formed to four sides with a width of 70 μm and a length of 900 μm. The through-holes shown in FIG. 14(A) were each shaped into a rectangular prism having a length of 410 μm on a side.

The light emitting structures after lift-off were observed with an optical microscope to find that X-shaped cracks widely extending from the corners to the center were formed in 38 out of 1900 of the examined structures (incidence was 2.0%) in Comparative Example 3. Crack spots were formed in the central region of 1045 of the light emitting structures, and the incidence was 55.0%. Further, etching was completed in 3.5 hours. X-shaped cracks widely extending from the corners to the center were formed in 108 out of 2038 of the examined structures (incidence was 5.3%) in Comparative Example 4. Crack spots were formed in the central region of 978 of the light emitting structures, and the incidence was 48.0%. Further, etching was completed in 4.5 hours.

INDUSTRIAL APPLICABILITY

According to the present invention, first through-holes are formed to open in central regions of light emitting structures such that at least a lift-off layer is exposed, and an etchant is supplied from the first through-holes. Thus, high quality vertically structured Group III nitride semiconductor LED chips with reduced cracks formed in the light emitting structures can be manufactured more efficiently.

REFERENCE SIGNS LIST

100: Vertically structured Group III nitride semiconductor LED chip
101: Growth substrate
102: Lift-off layer
103: First conductivity type Group III nitride semiconductor layer
104: Light emitting layer
105: Second conductivity type Group III nitride semiconductor layer
106: Light emitting structure laminate
107: Light emitting structure
108: First through-hole
109: Conductive support having lower electrode
109A: Conductive support after cut
110: Second through-hole
111: Upper electrode
111A: Pad electrode

The invention claimed is:

1. A method for manufacturing a vertically structured Group III nitride semiconductor LED chip, the method comprising:
a first step of forming a light emitting structure laminate by sequentially stacking a first conductivity type Group III nitride semiconductor layer, a light emitting layer, and a second conductivity type Group III nitride semiconductor layer on a growth substrate with a lift-off layer provided therebetween, the second conductivity type Group III nitride semiconductor layer being different from the first conductivity type Group III nitride semiconductor layer;
a second step of forming a plurality of separate light emitting structures by partially removing the light emitting structure laminate to partially expose the growth substrate;
a third step of forming a conductive support having a lower electrode, the conductive support integrally supporting the plurality of the separate light emitting structures, each of the plurality of the separate light emitting structures having: (i) a first through-hole formed to open in a central region such that at least the lift-off layer is exposed, and (ii) a second through-hole provided in a portion penetrating through the conductive support, the portion corresponding to the central region of each of the light emitting structures, the second through-hole being in communication with the first through-hole in each of the plurality of the light emitting structures;
a fourth step of separating the growth substrate from the plurality of the separate light emitting structures by removing the lift-off layer using a chemical lift-off process by supplying an etchant through the first through-hole; and
a fifth step of dividing the conductive support between the light emitting structures in order to singulate a plurality of LED chips, each of the plurality of LED chips having the light emitting structure supported by the conductive support.

2. The method for manufacturing a vertically structured Group III nitride semiconductor LED chip, according to claim 1, wherein in the second step, the plurality of the light emitting structures are made to have a cross-sectional shape with rounded corners.

3. The method for manufacturing a vertically structured Group III nitride semiconductor LED chip, according to claim 2, wherein in the second step, the plurality of the light emitting structures are made to have a cross-sectional shape of a quadrangle with rounded corners.

4. The method for manufacturing a vertically structured Group III nitride semiconductor LED chip, according to claim 3, wherein $R/L_0$ is in the range of 0.1 to 0.5, where R is a curvature radius of the corners of the plurality of the light emitting structures, and $L_0$ is a length of a side of the quadrangle of the plurality of the light emitting structures, R and $L_0$ are determined based on the corners of the quadrangle not being rounded.

5. The method for manufacturing a vertically structured Group III nitride semiconductor LED chip, according to claim 1, wherein the first through-hole and/or the second through-hole have/has a diameter of 20μm or more.

6. The method for manufacturing a vertically structured Group III nitride semiconductor LED chip according to claim 1, wherein the third step is performed by any one of: (i) a bonding method, (ii) a wet deposition process, and (iii) a dry deposition process.

7. A vertically structured Group III nitride semiconductor LED chip manufactured by the method for manufacturing a vertically structured Group III nitride semiconductor LED chip according to claim 1.

* * * * *